(12) United States Patent
Dupuis et al.

(10) Patent No.: US 10,581,208 B2
(45) Date of Patent: Mar. 3, 2020

(54) ETHERNET CONNECTOR WITH ELECTROMAGNETIC FILTERING

(71) Applicant: EQUIPEMENT ELECTROLINE INC., Montreal (CA)

(72) Inventors: Martin Dupuis, Montreal (CA); Arlindo Da Costa, Montreal (CA)

(73) Assignee: EQUIPEMENT ELECTROLINE INC., Montreal (CA)

( * ) Notice: Subject to any disclaimer, the term of this patent is extended or adjusted under 35 U.S.C. 154(b) by 0 days.

(21) Appl. No.: 16/161,609

(22) Filed: Oct. 16, 2018

(65) Prior Publication Data

US 2019/0115699 A1    Apr. 18, 2019

Related U.S. Application Data

(60) Provisional application No. 62/572,662, filed on Oct. 16, 2017.

(51) Int. Cl.
| | |
|---|---|
| *H01R 13/719* | (2011.01) |
| *H01R 13/66* | (2006.01) |
| *H01R 13/6471* | (2011.01) |
| *H05K 7/10* | (2006.01) |
| *H01R 13/6581* | (2011.01) |
| *H01R 24/64* | (2011.01) |

(52) U.S. Cl.
CPC ....... *H01R 13/719* (2013.01); *H01R 13/6471* (2013.01); *H01R 13/6658* (2013.01); *H05K 7/1092* (2013.01); *H01R 13/6581* (2013.01); *H01R 24/64* (2013.01); *H01R 2201/04* (2013.01)

(58) Field of Classification Search
CPC .............. H01R 13/719; H01R 13/6471; H01R 13/6658; H01R 13/6581; H01R 124/64; H05K 7/1092
See application file for complete search history.

(56) References Cited

U.S. PATENT DOCUMENTS

| 6,475,009 B2 * | 11/2002 | Below .................... H01R 24/64 439/271 |
| 6,817,902 B2 * | 11/2004 | Bernardi .............. G02B 6/3879 439/274 |
| 6,903,910 B1 | 6/2005 | Griesing et al. |
| 7,286,871 B2 | 10/2007 | Cohen |

(Continued)

FOREIGN PATENT DOCUMENTS

| WO | 2011137261 | 11/2011 |
| WO | 2018053596 | 3/2018 |

*Primary Examiner* — Briggitte R. Hammond
(74) *Attorney, Agent, or Firm* — Benoit & Cote Inc.; Charles-Andre Caron

(57) ABSTRACT

There is described a modular connector receptacle comprising a shield and a modular connector assembly. The shield comprises an electrically-conductive material, and comprises a lumen defining an inner surface which comprises a thread. The modular connector assembly comprises peripheral winglets which engage with the thread of the inner surface of the lumen for screwably housing the modular connector assembly inside the shield. The peripheral winglets are electrically conductive, thus providing a ground. Low-pass filters are provided on a PCB in the modular connector assembly, and the PCB comprising the low-pass filters can have a PCB shield enclosing the PCB and electrically connected to the peripheral winglets for grounding to the shield.

17 Claims, 7 Drawing Sheets

(56) References Cited

U.S. PATENT DOCUMENTS

| | | |
|---|---|---|
| 7,292,835 B2 | 11/2007 | Sorrells et al. |
| 7,555,016 B2 | 6/2009 | Page |
| 7,724,204 B2 | 5/2010 | Annamaa et al. |
| 8,582,312 B2 | 11/2013 | Kawano et al. |
| 8,998,508 B2 | 4/2015 | Nealis et al. |
| 9,106,415 B2 | 8/2015 | Sturkovitch et al. |
| 9,203,369 B2 | 12/2015 | Cook et al. |
| 9,203,473 B1 | 12/2015 | De Parga Bernal et al. |
| 9,224,728 B2 | 12/2015 | Kosowsky et al. |
| 9,287,636 B2 * | 3/2016 | Song ................. H01R 4/36 |
| 2003/0148652 A1 * | 8/2003 | Bernardi ........... G02B 6/3879 |
| | | 439/462 |
| 2004/0242067 A1 * | 12/2004 | Oyamada ........... H01R 13/502 |
| | | 439/587 |
| 2005/0037634 A1 * | 2/2005 | Khemakhem ........ H01R 24/52 |
| | | 439/63 |
| 2005/0119025 A1 | 6/2005 | Mohindra et al. |
| 2010/0130070 A1 * | 5/2010 | Isaac ................... H01R 13/64 |
| | | 439/680 |
| 2018/0109041 A1 | 4/2018 | Ramsey |
| 2019/0115699 A1 * | 4/2019 | Dupuis ............... H01R 13/719 |

* cited by examiner

ETHERNET CONNECTOR WITH ELECTROMAGNETIC FILTERING

CROSS-REFERENCE TO RELATED APPLICATIONS

This application claims benefit of U.S. provisional patent application 62/572,662, filed Oct. 16, 2017, which is hereby incorporated herein by reference in its entirety.

BACKGROUND

(a) Field

The subject matter disclosed generally relates to modular connectors such as ethernet connectors. More specifically, it relates to an electromagnetic-filtering adapter for Ethernet connectors.

(b) Related Prior Art

Modular connectors such as those used for phone lines and Ethernet cables are found in various environments.

Devices such as LTE backhauls and security cameras are among devices that comprise Ethernet connectors exposed to the environment. They undergo various weather conditions that can damage the connector, and electromagnetic radiations (especially in the case of LTE backhauls which are installed in locations having very intense electromagnetic radiations in the environment) that can introduce noise into the signal communicated through the connector.

There is thus a need for improved electromagnetic radiation ingress (and egress) prevention, and protection against damages induced by weather or lightning. The improvement should further be cost-effective, while maintaining a 1 Gb/s throughput.

SUMMARY

According to an embodiment, there is provided a modular connector receptacle for installation on a device having an electromagnetic radiation protective casing, the modular connector receptacle comprising: a shield comprising an attachment member for mounting the modular connector receptacle to the device, the shield further comprising an electrically-conductive material, the shield comprising a lumen defining an inner surface which comprises a securing member; and a modular connector assembly which engages with the securing member of the inner surface of the lumen for housing the modular connector assembly substantially inside the shield (i.e., a major portion of the modular connector assembly is housed within the shield and a small fraction of the modular connector assembly may extend outside the shield; in other embodiments, the modular connector assembly sits/is housed entirely inside the shield). The casing of the device and the shield provide and form a continuous electromagnetic radiation protection to prevent electromagnetic radiation to the modular connector assembly and to the components inside the device.

According to an aspect, the modular connector assembly further comprises peripheral winglets which are electrically conductive and which engage with the securing member.

According to an aspect, the securing member comprises a thread on the inner surface of the lumen, the thread being used for screwably housing the modular connector assembly substantially inside the shield.

According to an aspect, the modular connector assembly further comprises peripheral winglets which are electrically conductive and which engage with the thread of the inner surface of the lumen for screwably housing the modular connector substantially assembly inside the shield.

According to an aspect, the modular connector assembly further comprises: a PCB shield comprising an electrically-conductive material and acting as a grounding enclosure, which provides electrical ground to the low-pass filters connected thereto.

According to an aspect, the PCB shield is electrically connected to the peripheral winglets, which touch the shield, thus providing the electrical ground.

According to an aspect, the PCB transverse portion has a circular shape, thus conforming to the inner surface of the lumen of the shield.

According to an aspect, the PCB transverse portion is between a back of the jack and the peripheral winglets.

According to an aspect, the modular connector assembly further comprises: a jack of a modular connector, the jack comprising a plurality of pins and forming a female part of the modular connector.

According to an aspect, the modular connector assembly further comprises: a plurality of low-pass filters, each one being connected to a corresponding one of the plurality of pins.

According to an aspect, the modular connector assembly further comprises: a PCB for installing the plurality of low-pass filters, the PCB extending in a rearward direction from the jack.

According to an aspect, the modular connector assembly comprises a PCB transverse portion, which is transverse with respect to a longitudinal axis of the modular connector receptacle, the PCB transverse portion securing the PCB for installing the plurality of low-pass filters in the rearward direction.

According to an aspect, the shield has a substantially cylindrical shape.

According to an aspect, the shield has a front end comprising a polygonal shape.

According to an aspect, the attachment member comprises a cylindrical protrusion having an outer surface comprising a thread for screwing the modular connector receptacle to a cooperating threaded entry port of the device whereby the modular connector receptacle extends outside the device when installed thereto.

According to an aspect, the shield has a rear end comprising a cylindrical protrusion, an outer surface thereof comprising a thread for mounting the modular connector receptacle onto an outside surface of an apparatus and extending outside the apparatus when mounted thereonto.

According to an embodiment, there is provided a modular connector receptacle comprising: a shield comprising an electrically-conductive material, the shield comprising a lumen defining an inner surface which comprises a thread; and a modular connector assembly which engages with the thread of the inner surface of the lumen for screwably housing the modular connector assembly substantially inside the shield.

According to an aspect, the modular connector assembly further comprises peripheral winglets which are electrically conductive and which engage with the thread of the inner surface of the lumen for screwably housing the modular connector assembly substantially inside the shield.

According to an aspect, the modular connector assembly further comprises: a PCB shield comprising an electrically-conductive material and acting as a grounding enclosure, which provides electrical ground to the low-pass filters connected thereto.

According to an aspect, the PCB shield is electrically connected to the peripheral winglets, which touch the shield, thus providing the electrical ground.

According to an aspect, the PCB transverse portion has a circular shape, thus conforming to the inner surface of the lumen of the shield.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Figure 1:
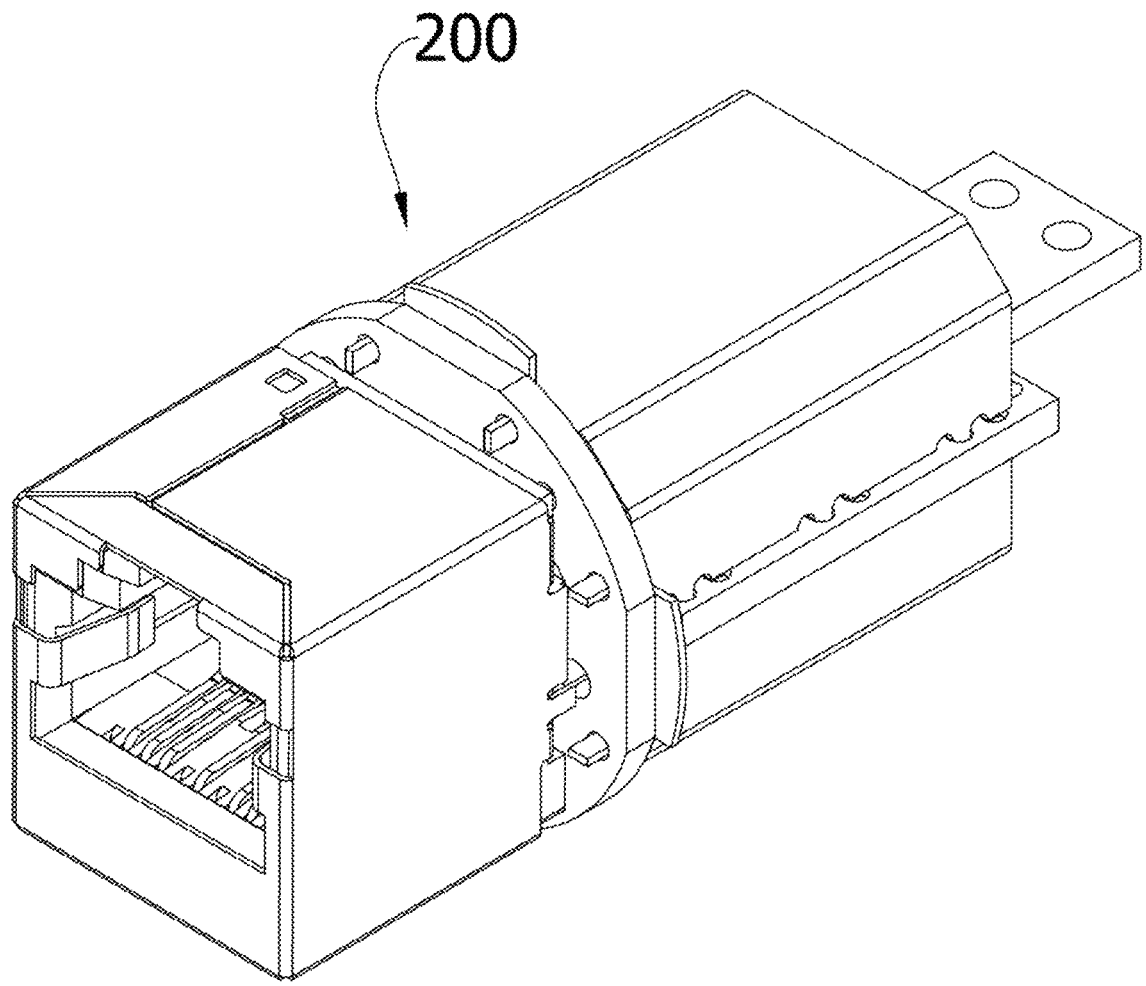
FIG. 1 is a perspective view illustrating a modular connector assembly to be housed in a shield, according to an embodiment.
Figure 3:
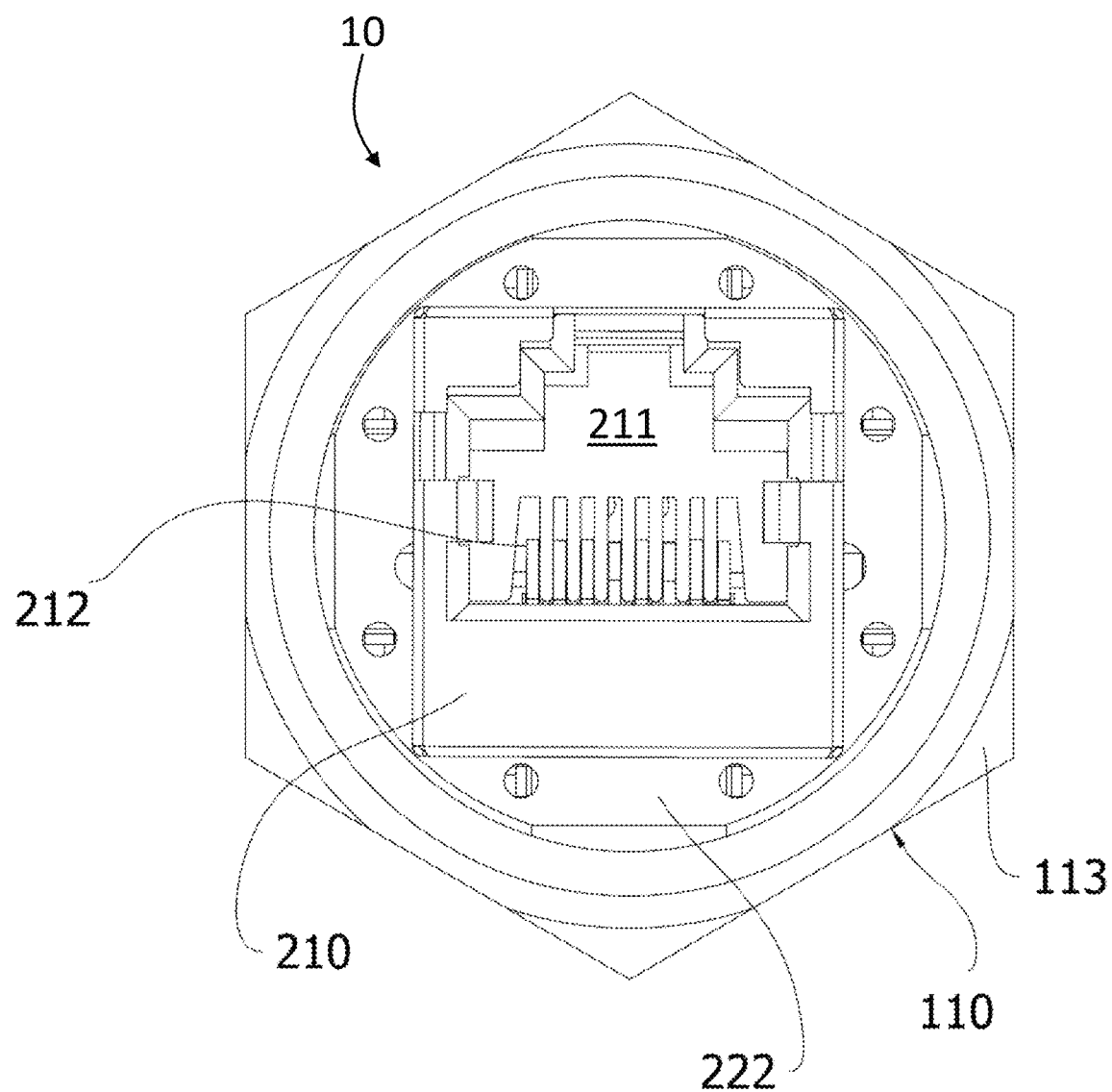
FIG. 3 is a front view illustrating a modular receptacle comprising a shield with an Ethernet connector assembly housed therein, according to an embodiment.
Figure 4:
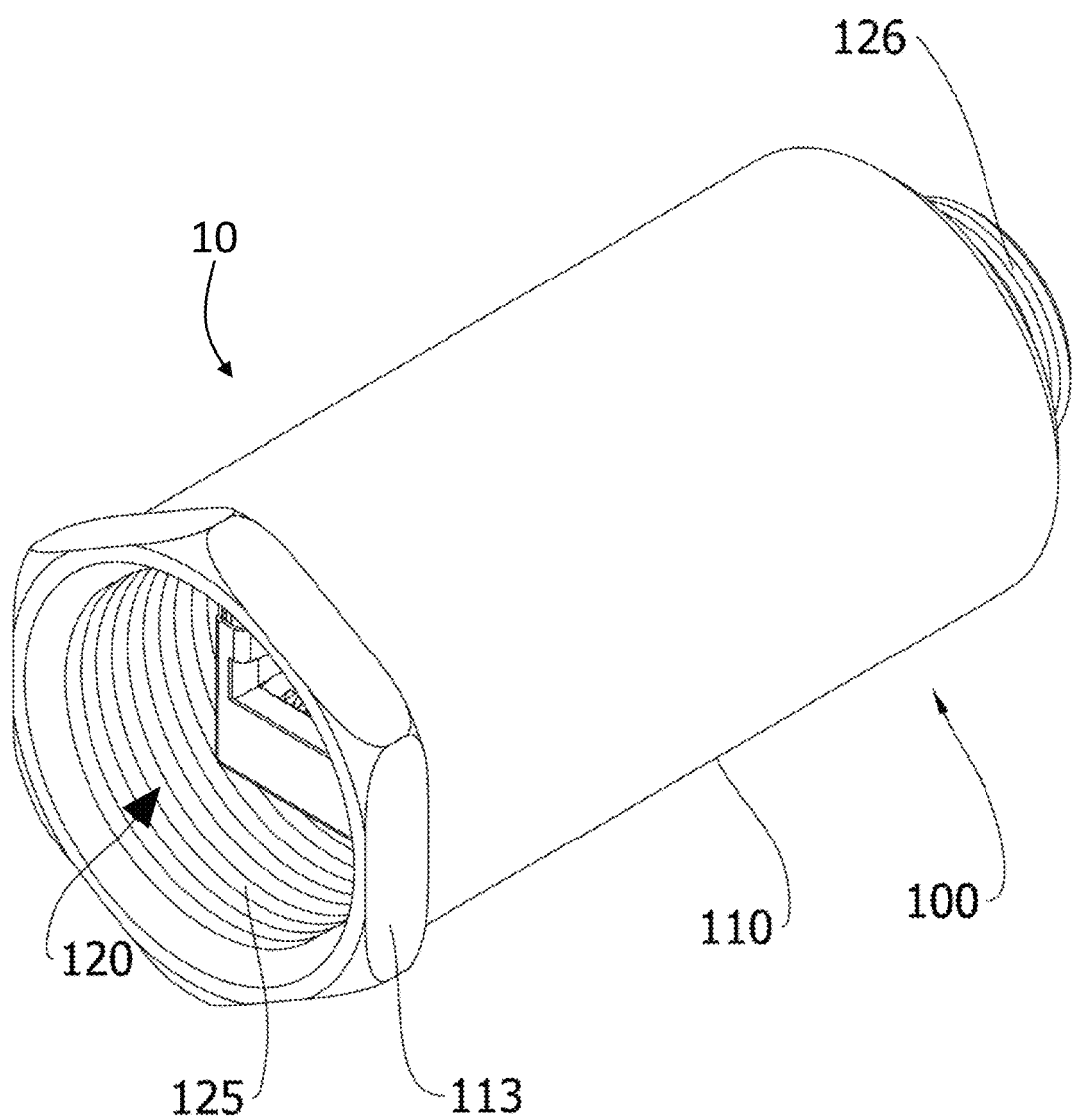
FIG. 4 is a perspective view illustrating the modular receptacle of FIG. 3.
Figure 5:
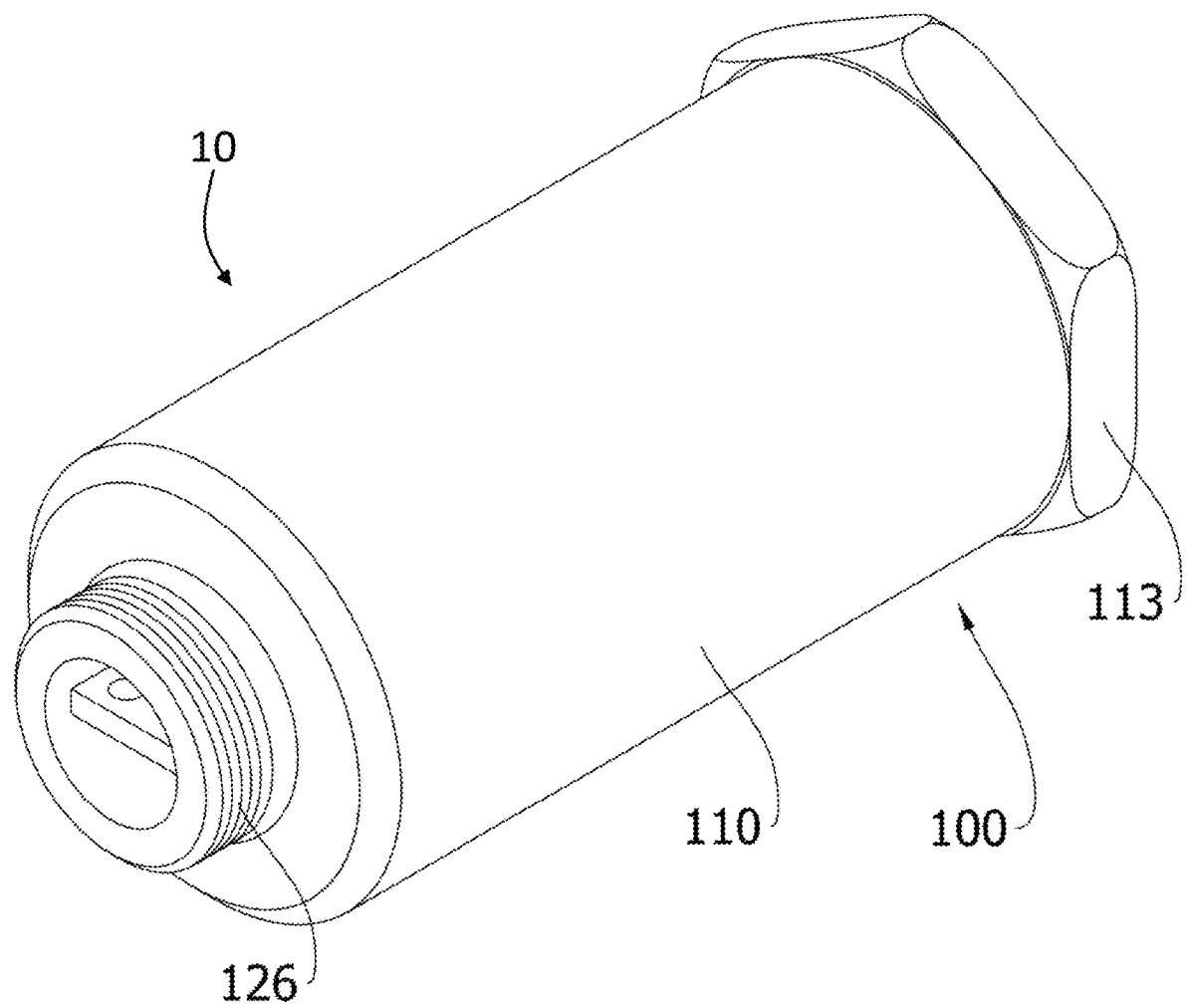
FIG. 5 is a rear perspective view illustrating the modular receptacle of FIG. 3.

Referring to FIG. 1, there is shown a modular connector assembly 200 to form the female part of a modular connector of an Ethernet receptacle, or more generally a modular connector receptacle 10 (see FIGS. 4 and 6), which comprises a shield 100, shown in FIGS. 3-5. The modular connector assembly 200 is housed within the shield 100. The shield 100 is waterproof and, as it is preferably metallic, protects the modular connector assembly 200 from other sources of damage, including electromagnetic radiations (ingress), and further prevents egress.

The term "receptacle" refers to the female part of an electrical connector (i.e., a modular connector in the present description), including both the electrical parts that form the female part of the electrical connector and the enclosure therefor.

The modular connector receptacle 10 can be installed on the typical entry port of a device 12 and replaces this entry port for a modular plug of a cable to be plugged thereinto. An example of an entry port would be the ⅝"-diameter entry port comprising a jack of a modular connector, as found on many types of telecommunication cable equipment.

Figure 2:
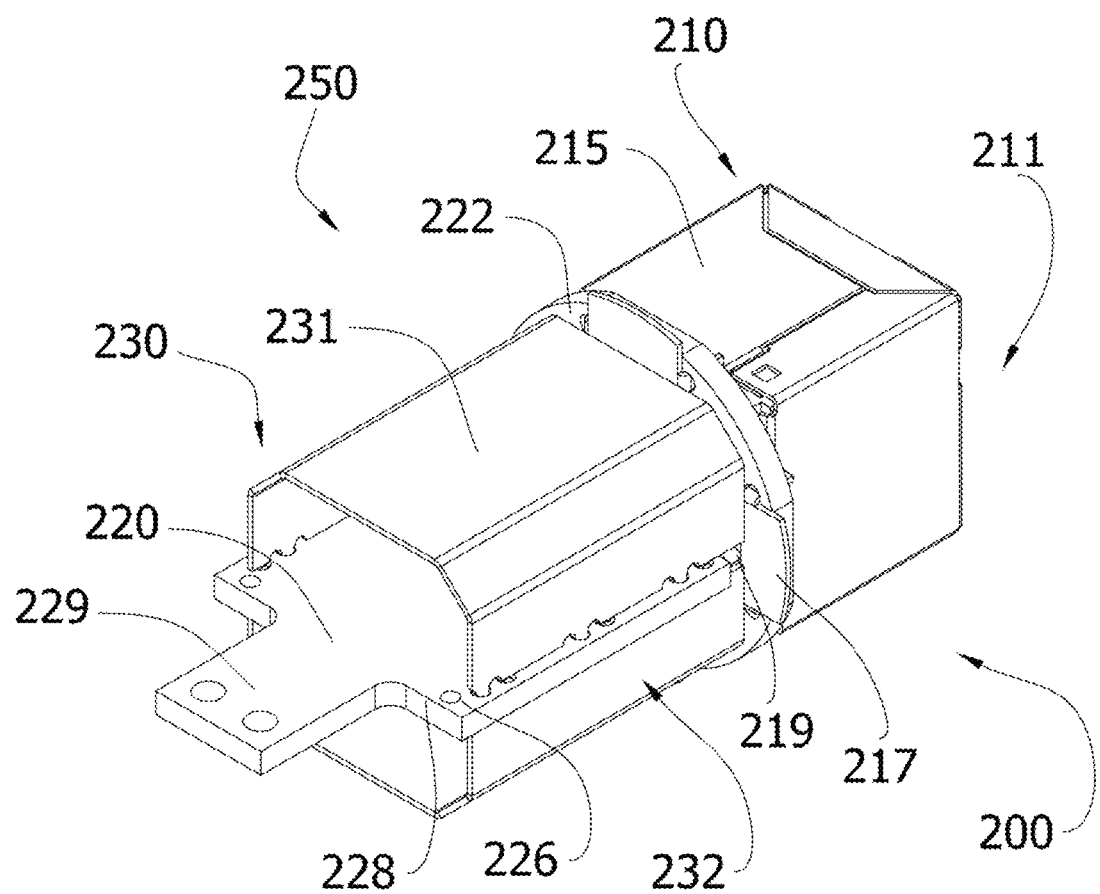
FIG. 2 is a rear perspective view illustrating the modular connector assembly of FIG. 1, according to an embodiment.

FIG. 2 illustrates the modular connector assembly 200. The modular connector assembly 200 comprises a modular connector jack 210, or Ethernet jack, which is assembled to a filtering circuit 250 to form the modular connector assembly 200.

The modular connector jack 210 can be a standard jack for receiving a modular connector plug (not shown), or Ethernet plug. In most applications, the modular connector plug is the standard end connector plug of an Ethernet over twisted pair cable. For example, it can be an 8P8C (8 pins, 8 contacts) connector plug and, accordingly, in an embodiment, the modular connector jack 210 is an 8P8C connector jack, or RJ45 connector jack. The opening 211 forming the inner portion of the modular connector jack 210 is shown in FIG. 3, where the contacts 212 of the modular connector jack 210 are illustrated.

The modular connector jack 210 comprises an enclosure 215 which substantially has a cubic shape, although other shapes would be suitable as long as modular connector jack 210 has the shape required to receive the plug for the intended application. In an embodiment, the enclosure 215 can be metallic to provide better grounding.

In the embodiment where the modular connector jack 210 is an 8P8C connector jack, or RJ45 connector jack, there are 8 pins (corresponding to the contacts 212) extending behind the enclosure 215 of the modular connector jack 210, into the filtering circuit 250. Regardless the number of pins (4, 6, 8 or any other suitable number), the pins extend behind the enclosure 215 and each one needs to form a contact with a corresponding low-pass filter belonging to the filtering circuit 250.

According to an embodiment, and as shown in FIG. 2, a printed circuit board, or PCB 220, is provided as part of the filtering circuit 250. The PCB 220 provides the support on which the low-pass filters are provided. There should be as many low-pass filters as there are pins extending behind the modular connector jack 210, and each one of the pins should be connected in series only to a corresponding one of the low-pass filters.

Each one of the low-pass filters is then connected in series to a corresponding one of a plurality of wires that are routed into the device 12 for which the receptacle 10 is needed. Such wires can be connected (e.g., soldered) on the holes 226 made into the PCB 220, for connection to their corresponding low-pass filter, and extend away from the modular connector assembly 200.

According to an embodiment, the cutoff frequency of the low-pass filters is of about 400 MHz. This order of magnitude of cutoff frequency is appropriate for Ethernet connectors due to the frequencies of the signals carried by Ethernet over twisted-pair cables.

According to an embodiment, a circular PCB 222 is provided and secures the PCB 220 (e.g., soldered thereto), the back of the enclosure 215 and the winglets 217 during assembly. The circular PCB 222, or PCB transverse portion, extends in a plane that is transverse with respect to the longitudinal axis of the receptacle 10 (i.e., the longitudinal axis of the cylinder making up the shield 100). The winglets 217 extend outwardly from the longitudinal axis; i.e., they extend in a radial direction from the longitudinal axis at a periphery of any one of: the circular PCB 222, the PCB shield 230, or a back of the modular connector jack 210. The whole assembly is then inserted into the lumen 120 (where the circular PCB 222 has a circular shape of a diameter than the lumen 120) and can advantageously be screwed by having the winglets cooperate in a screwable manner with (i.e., engage with) the thread 125 formed on the inner surface of the lumen 120. The whole assembly thus needs to have its peripheral winglets 217 engage with the thread 125 at the entrance of the shield 100, and a rotation movement induces screwing thereinto, eventually resulting in housing of the modular connector assembly 200 inside the shield 100 for protection against weather and electromagnetic events.

It should be noted that the thread 125 is more broadly referred to herein as a securing member which is inside the lumen 120. According to different embodiments, the securing member comprises one of: a snap fit type of arrangement between the winglets 217 and the inside of the lumen; a wall inside the lumen 217 against which the winglets 217 come to rest under the pressure of another device installed inside the lumen which is locks the winglets 217 in place against the wall; a clipping device inside the lumen; a biasing device inside the lumen; and a lip or lips which interact with the winglets 217.

According to an embodiment, the pins extending behind the enclosure 215 extend through and are soldered to the circular PCB 222. In an embodiment, the winglets 217 can be secured to the circular PCB 222, e.g., by soldering, and they have a shape that grips over the circular PCB 222, thereby holding the circular PCB 222 and further securing it to the enclosure 215. As discussed further below, the winglets 217 can further act as a screw and be used to make the modular connector assembly 200 screwable within the barrel-shaped shield 100, which has a threaded inner surface of its lumen 120. Eventually, the winglets 217 can secure the modular connector assembly 200 to the shield 100 while grounding the modular connector assembly 200 to provide electromagnetic compatibility.

According to an embodiment, there is further provided a PCB shield 230, acting as a grounded enclosure which can be made of an upper part 231 and a lower part 232, which cooperate with the top and down surfaces of the PCB 220 that it protects, thus forming an enclosure around the PCB 220 and acting as a shield therearound. In an embodiment, the shield 230 comprises pins extending through bores of the PCB to mount the grounded enclosure thereon. According to an embodiment, the shield 230 is longer, i.e., extends longer backwardly, than shown in FIG. 2.

According to an embodiment, each of the low-pass filters comprise a ground connector. Each ground connector is electrically connected to the shield 230, thereby providing a common reference ground to all low-pass filters, hence reducing noise and enhancing the quality of filtering performed by the low-pass filters.

In order to provide the ground, the shield 230 has an edge 219 that makes an electrical contact, with at least one of the winglets 217, which in turn extends radially outwardly such as to make an electrical contact with an electrically-conductive lumen of the shield 100, thereby providing the ground to all low-pass filters. The winglets 217 should thus be electrically conductive. For example, they can be soldered at the edge 219 for improved grounding of the shield 230, the soldering further improving the securing of the shield 230 with the winglets 217.

The shield 100 is shown in FIGS. 4-5. The shield 100 has a body 110 comprising an electrically conductive material, such as an electrically conductive metal. The shield 100 thus acts as a Faraday cage.

The shield 100 provides protection against electromagnetic radiations that could affect the signal transmitted through the modular connector. By providing such a protection, the shield is said to provide electromagnetic compatibility. The shield 100 thus offers protection against undesirable electromagnetic radiations that complements that offered by the low-pass filters in the filtering circuit 250.

Moreover, the shield 100 forwardly extends in front of the modular connector jack 210, hence providing mechanical protection against water, dust and other debris. This protection is provided by the shape extending in front of the modular connector jack 210 as well as the solid material (i.e., metal) forming the body 110.

For ease of manufacture, the receptacle 10 can have a cylindrical shape, well suited for fast machining. Regardless of the outside shape of the body 110, the shield 100 defines a lumen 120 inside the shield 100. The lumen 120 should be a cylindrical bore, thus making the shield 100 a tube. The entry of the shield 100 is found at the open end shown in FIG. 4, where an edge 113 is defined. In an embodiment, the edge 113 can have a shape that facilitates the manipulation of the receptacle 10, preferably of a polygonal shape; e.g., a hexagonal shape to facilitate screwing the receptacle 10 using standard screwing tools. More precisely, the edge 113 has a standard shape that further allows connecting a cable gland and providing a ridge for retaining a heat shrink tube upon connecting the Ethernet connector.

According to an embodiment, there is provided a thread 125 within the inner surface of the lumen 120 of the shield 100.

According to an embodiment, the device 12 on which the receptacle 10 is mounted, such as an LTE backhaul, has an entry port with a thread having a given shape, and the thread 125 at the entry of the lumen 120 of the shield 100 has the same shape. Moreover, the shield 100 comprises a threaded protrusion 126 forming a screw, at the end opposite the entry of the shield 100. The threaded protrusion 126 cooperates with, i.e., be screwed into, the thread at the entry port of the device 12 which should have the same shape as the thread 125 at the entry of the lumen 120 for better compatibility, i.e., such that the entry of the receptacle 10 or the entry port into the device 12 can both be used to plug the same connector plug thereinto.

It should be noted that the threaded protrusion 126 is more broadly referred to herein as an attachment member which is at one end of the shield 100. According to different embodiments, the attachment member comprises one of: a snap fit type of arrangement between the attachment member and the entry port of device 12; a clipping device inside or outside the entry port of device 12; a biasing device inside the entry port of device 12; a pin and groove type arrangement between the attachment member and the entry port of device 12; and a lip or lips inside the entry port of device 12 which interact with the attachment member.

According to an embodiment, the thread 125 extends within the inner surface of the lumen 120 up to about half the lumen 120. The winglets 217, which extend radially outwardly, should extend at a radial distance from the central longitudinal axis of the lumen 120 that allows the winglets 217 to engage within the thread 125. This should allow the modular connector assembly 200 to be screwed within the lumen 120, until about the end of the thread 125, where the winglets 217 secure the modular connector assembly 200 to the inner bore of the shield 100. To block further movement of the modular connector assembly 200, the modular connector assembly 200 can comprises a tab 229, shown in FIG. 2, which is narrower than the remainder of the PCB 220 and thus defines a shoulder 228 on an edge of the PCB 220 that abuts at the inner end of the shield 100, inside the lumen 120 and close to the threaded protrusion 126. The tab 229 extends within the lumen of the threaded protrusion 126 and guide the wires (e.g., the 8 wires of the 8 pins and contacts originating from the corresponding 8 low-pass filters) into the device 12. In an embodiment, an adhesive such as epoxy can be added to secure the modular connector assembly 200 to the inner bore of the shield 100.

Moreover, when selecting a material for a specific part or a plating for the material, such as a metal, it should be chosen to prevent galvanic corrosion.

Figure 6:
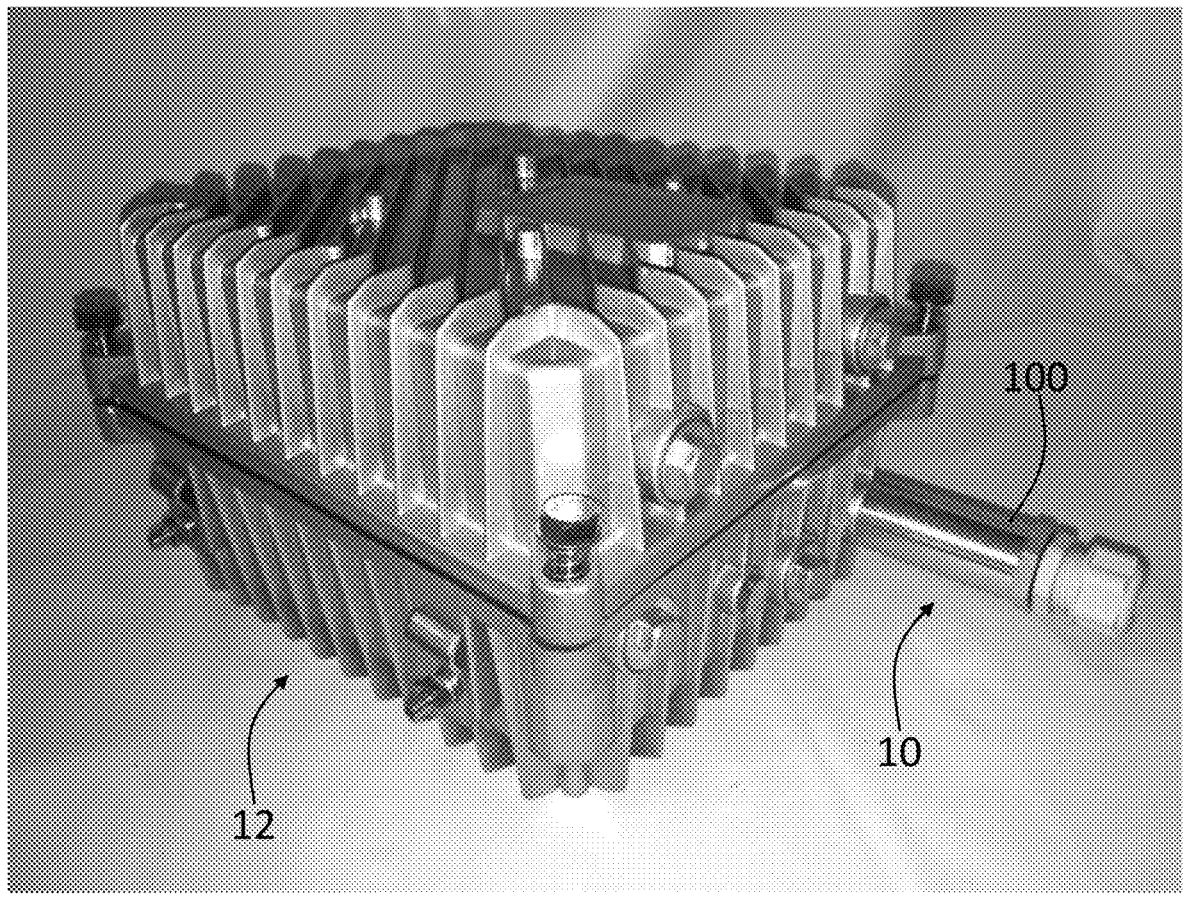
FIG. 6 is a photograph illustrating a device with an embodiment of an Ethernet receptacle mounted thereon.
Figure 7:
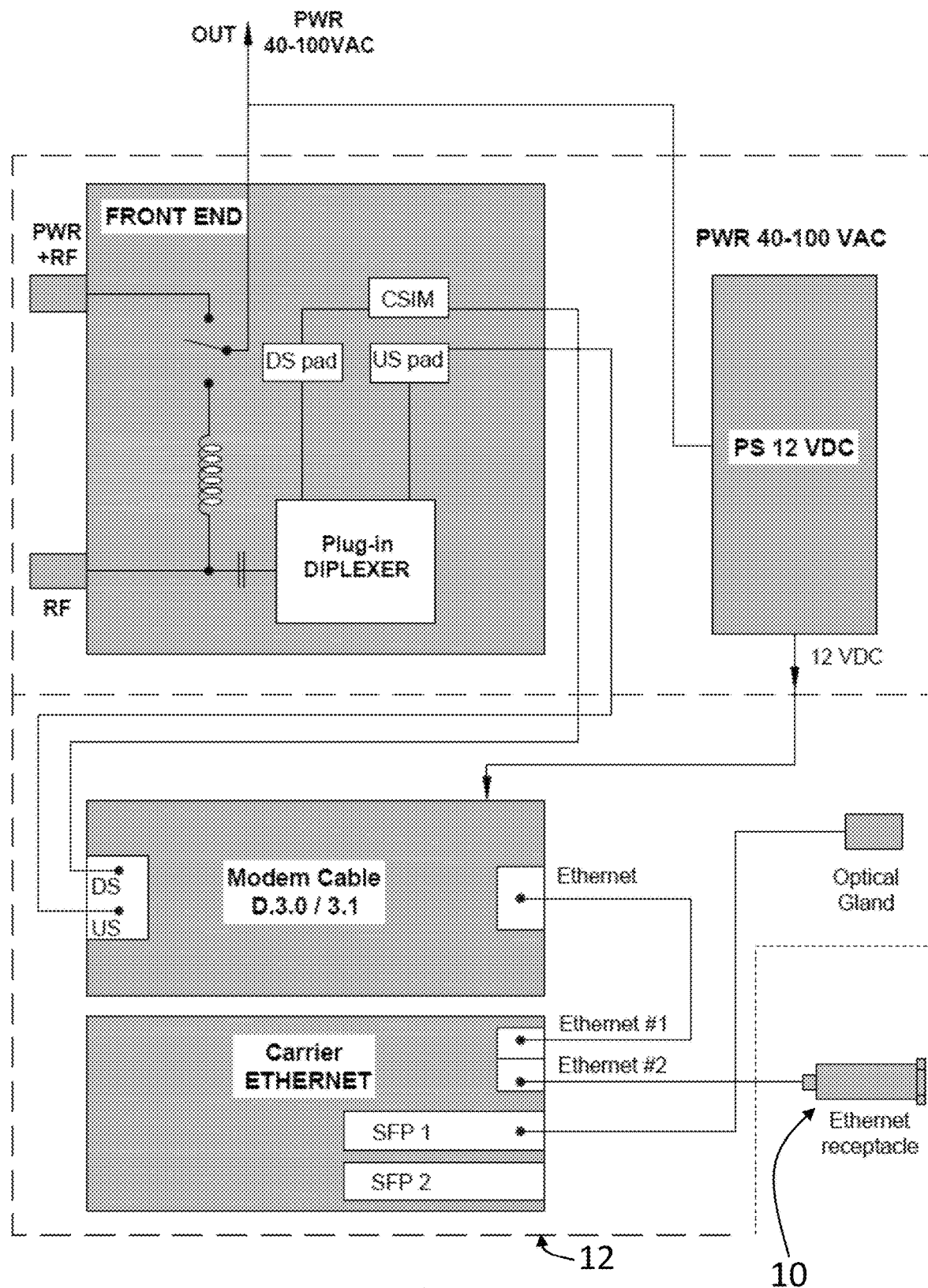
FIG. 7 is a schematic diagram illustrating an LTE backhaul with an embodiment of an Ethernet receptacle connected thereto.

An example of a device 12 is shown in FIGS. 6-7. FIG. 6 is a picture showing an LTE backhaul, enclosed in a box, with the receptacle 10 extending therefrom with the shield plainly visible. FIG. 7 is a diagram showing an architecture of the LTE backhaul, with the Ethernet receptacle connected thereto.

The architecture of the LTE backhaul shown in FIG. 7 is exemplary; for example, there may not be a carrier Ethernet module. Moreover, the receptacle 10 may be installed on other types of apparatuses. More particularly, it can advantageously be installed on any apparatus comprising a ⅝" connector (as standardized by the Society of Cable TV Engineers, or SCTE) which is accessible from the outside (i.e., outdoors where weather can have an impact on the connector).

The receptacle 10 thus provides the modular connector, especially an Ethernet connector, with highly reliable protection against weather, including water, dust and debris, shocks, and electromagnetic radiations, made possible by the shield 100 inside which the modular connector assembly 200 is housed. These features can also prevent corrosion and protect against electric surges such as those induced by lightning (surge waves, combo waves). This modular connector assembly 200 further comprises low-pass filters that filter frequencies above 400 MHz and which can affect the Ethernet signal by introducing noise into the useful bands of the signals being communicated through the Ethernet connector. The low-pass filters are made more reliable for filtering by being grounded to shield 100.

Filters for other frequencies can be provided in the filtering circuit for modular connectors used in applications other than Ethernet but using the same type of connector.

While the shield 100 and filtering circuit 250 provide electromagnetic radiation ingress protection, which can be useful in environment where the environment signals are strong such as an LTE backhaul, the shield 100 and filtering circuit 250 further provide egress protection. It can be useful in locations where egress is to be kept at a minimum. It is further useful to prevent egress into another port of the device 12, for example if there exist on the same device 12 an open coaxial cable connection that would otherwise receive such egress and introduce noise into the device 12.

It should be noted that the Ethernet receptacle has a marginal effect on the signal carried by the cable connected thereto, such as to be effectively transparent for a CAT-6 cable with a rate of transmission of 1 Gb/s. Furthermore, it should tolerate electric currents through the modular connector, for example by withstanding standards such as a power over Ethernet standard (PoE), which is useful for feeding power to the device 12. For example, an IP camera can be fed with electric current transmitted through the Ethernet cable.

Finally, the receptacle for a modular connector described above can be advantageously manufactured at a low cost.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A modular connector receptacle for installation on a device having an electromagnetic radiation protective casing, the modular connector receptacle comprising:
   a shield comprising an attachment member for mounting the modular connector receptacle to the device, the shield further comprising an electrically-conductive material, the shield comprising a lumen defining an inner surface which comprises a securing member; and
   a modular connector assembly which engages with the securing member of the inner surface of the lumen for housing the modular connector assembly substantially inside the shield, the modular connector assembly comprising peripheral winglets which are electrically conductive and which engage with the thread of the inner surface of the lumen for screwably housing the modular connector assembly inside the shield.

2. The modular connector receptacle of claim 1, wherein the attachment member comprises a cylindrical protrusion having an outer surface comprising a thread for screwing the modular connector receptacle to a cooperating threaded entry port of the device whereby the modular connector receptacle extends outside the device when installed thereto.

3. The modular connector receptacle of claim 1, wherein the securing member comprises a thread on the inner surface of the lumen, the thread being used for screwably housing the modular connector assembly substantially inside the shield.

4. The modular connector receptacle of claim 3, wherein the modular connector assembly further comprises:
   a PCB shield comprising an electrically-conductive material and acting as a grounding enclosure, which provides electrical ground to the low-pass filters connected thereto.

5. The modular connector receptacle of claim 4, wherein the PCB shield is electrically connected to the peripheral winglets, which touch the shield, thus providing the electrical ground.

6. The modular connector receptacle of claim 1, wherein the modular connector assembly further comprises:
   a jack of a modular connector, the jack comprising a plurality of pins and forming a female part of the modular connector.

7. The modular connector receptacle of claim 6, wherein the modular connector assembly further comprises:
   a filtering circuit comprising a plurality of low-pass filters, the filtering circuit being in contact with the plurality of pins such that each one of the plurality of low-pass filters is connected to a corresponding one of the plurality of pins.

8. The modular connector receptacle of claim 7, wherein the filtering circuit further comprises:
   a PCB for installing the plurality of low-pass filters, the PCB extending in a rearward direction from the jack.

9. The modular connector receptacle of claim 8, wherein the modular connector assembly comprises a PCB transverse portion, which is transverse with respect to a longitudinal axis of the modular connector receptacle, the PCB transverse portion securing the PCB for installing the plurality of low-pass filters in the rearward direction.

10. The modular connector receptacle of claim 9, wherein the PCB transverse portion has a circular shape, thus conforming to the inner surface of the lumen of the shield.

11. The modular connector receptacle of claim 10, wherein the PCB transverse portion is between a back of the jack and the peripheral winglets.

12. The modular connector receptacle of claim 1, wherein the shield has a substantially cylindrical shape.

13. The modular connector receptacle of claim 12, wherein the shield has a front end comprising a polygonal shape.

14. A modular connector receptacle comprising:
a shield comprising an electrically-conductive material, the shield comprising a lumen defining an inner surface which comprises a thread; and
a modular connector assembly which engages with the thread of the inner surface of the lumen for screwably housing the modular connector assembly substantially inside the shield, the modular connector assembly comprising peripheral winglets which are electrically conductive and which engage with the thread of the inner surface of the lumen for screwably housing the modular connector assembly substantially inside the shield.

15. The modular connector receptacle of claim 14, wherein the modular connector assembly further comprises:
a PCB shield comprising an electrically-conductive material and acting as a grounding enclosure, which provides electrical ground to the low-pass filters connected thereto.

16. The modular connector receptacle of claim 15, wherein the PCB shield is electrically connected to the peripheral winglets, which touch the shield, thus providing the electrical ground.

17. The modular connector receptacle of claim 16, wherein the PCB transverse portion has a circular shape, thus conforming to the inner surface of the lumen of the shield.

* * * * *